United States Patent [19]

Gabriel et al.

[11] Patent Number: 4,672,414
[45] Date of Patent: Jun. 9, 1987

[54] PLANAR HETEROJUNCTION BIPOLAR DEVICE AND METHOD

[75] Inventors: Nancy J. S. Gabriel; Han-Tzong Yuan, both of Dallas; Shiban K. Tiku, Richardson, all of Tex.

[73] Assignee: Texas Instruments Incorporated, Dallas, Tex.

[21] Appl. No.: 750,387

[22] Filed: Jun. 28, 1985

[51] Int. Cl.[4] ............................................. H01L 29/72
[52] U.S. Cl. ........................................ 357/34; 357/16; 357/49; 357/61
[58] Field of Search .................... 357/16, 34, 61, 49

[56] References Cited

U.S. PATENT DOCUMENTS

| 4,445,130 | 4/1984 | Poulain et al. | 357/16 |
| 4,482,910 | 11/1984 | Nishizawa et al. | 357/16 |
| 4,529,996 | 7/1985 | Pande | 357/16 |
| 4,559,547 | 12/1985 | Shiraki et al. | 357/16 |

Primary Examiner—Edward J. Wojciechowicz
Attorney, Agent, or Firm—Carlton H. Hoel; Leo N. Heiting; Melvin Sharp

[57] ABSTRACT

Vertical AlGaAs heterojunction bipolar transistors (30) with planar structure together with fabrication methods therefor are disclosed. For an emitter (44) on top structure, the contacts (46) to the base (38) are formed by a diffusion of zinc dopants from the surface, and contacts (42) to the collector (34, 36) are formed by diffusions of sulfur dopants from the surface rather than by etch of connecting vias. Further, device isolation is also provided by zinc diffusions (54) rather than by mesa formation. These diffusions are by rapid thermal pulses.

8 Claims, 12 Drawing Figures

PLANAR HETEROJUNCTION BIPOLAR DEVICE AND METHOD

BACKGROUND OF THE INVENTION

The present invention relates to electronic semiconductor devices and methods of fabrication, and, more specifically, to gallium arsenide heterojunction bipolar devices that have planar structure suitable for large scale integration.

Semiconductor devices made of gallium arsenide are preferred over devices made of silicon for high frequency applications due to the higher mobility of carriers in gallium arsenide; however, gallium arsenide material and fabrication technology lag far behind that of silicon. Indeed, gallium arsenide MESFET integrated circuits with more than a 1,000 gates have been fabricated (for example, Toyoda et al, A 42ps 2K-Gate GaAs Gate Array, 1985 ISSCC Dig. Tech. Papers 206), but the precise control of device parameters such as threshold voltage for larger scale integration has not yet been achieved. Similarly, HEMTs, which use the two dimensional electron gas at a heterojunctions of gallium arsenide and aluminum gallium arsenide, provide fast devices but suffer from the lack of precise control of device parameters; see Mimura et al, High Electron Mobility Transistors for LSI Circuits, 1983 IEDM Tech Digest 99.

Bipolar transistors have several advantages over FETs for high speed applications, and, for example, the turn-on voltage is determined by physical parameters and is not sensitive to the geometry and doping levels as is the threshold voltage o MESFETs or HEMTs. However, the fabrication of gallium arsenide bipolar (or heterojunction bipolar) transistors suitable for high speed applications, such as ECL, is complicated by the need for contacts to buried collector layers and isolation by mesa structures; see, Asbeck et al, 1984 GaAs IC Symp. Tech. Digest 132. Such non-planar devices are incompatible with high level integration. Consequently, attempts have been made to overcome these problems (Taira et al, New Lateral GaAs Transistor, 1984 IEDM Tech Digest 201), but the solutions are not satisfactory.

SUMMARY OF THE INVENTION

The present invention provides planar bipolar transistors and methods of fabrication in which emitter and base contacts are diffusions from the surface. Device isolation is also by diffusions from the surface, and this yields planar devices suitable for large scale integration and solves the problems of the known devices.

More specifically, preferred embodiments include a layered structure with layers of undoped aluminum gallium arsenide, n− type gallium arsenide, and n type aluminum gallium arsenide on a substrate and implant beryllium to convert a portion of the n− layer to p+ to form the base followed by diffusion of sulfur from the surface of the undoped layer to form an emitter over the base and to form a collector contact away from the base which is followed by diffusion of an annular region of zinc from the surface of the undoped layer to contact the base and enclose and isolate the emitter. A diffusion of a second annular region of zinc enclosing the device forms the isolation.

DESCRIPTION OF THE PREFERRED EMBODIMENTS

Figure 1A:
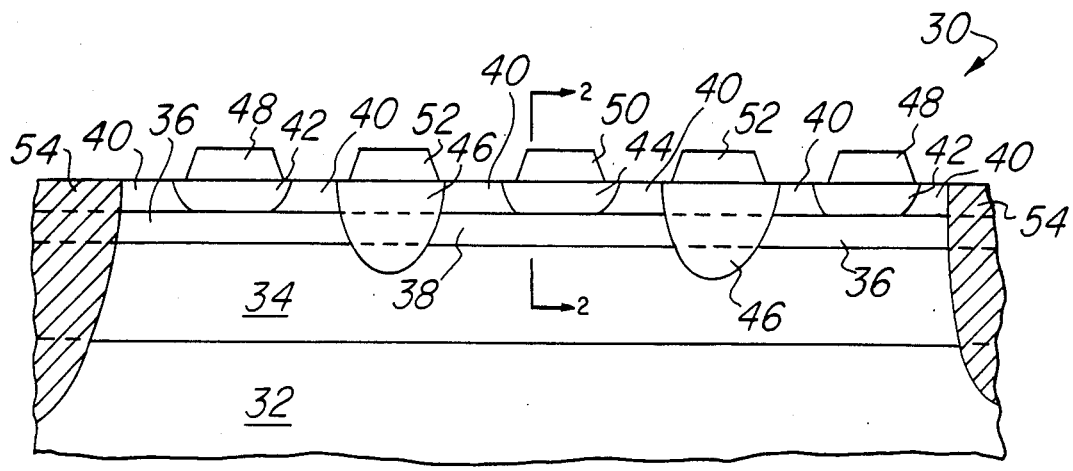
FIGS. 1A-B are schematic elevation and plan views of a first preferred embodiment heterojunction bipolar transistor.
Figure 1B:
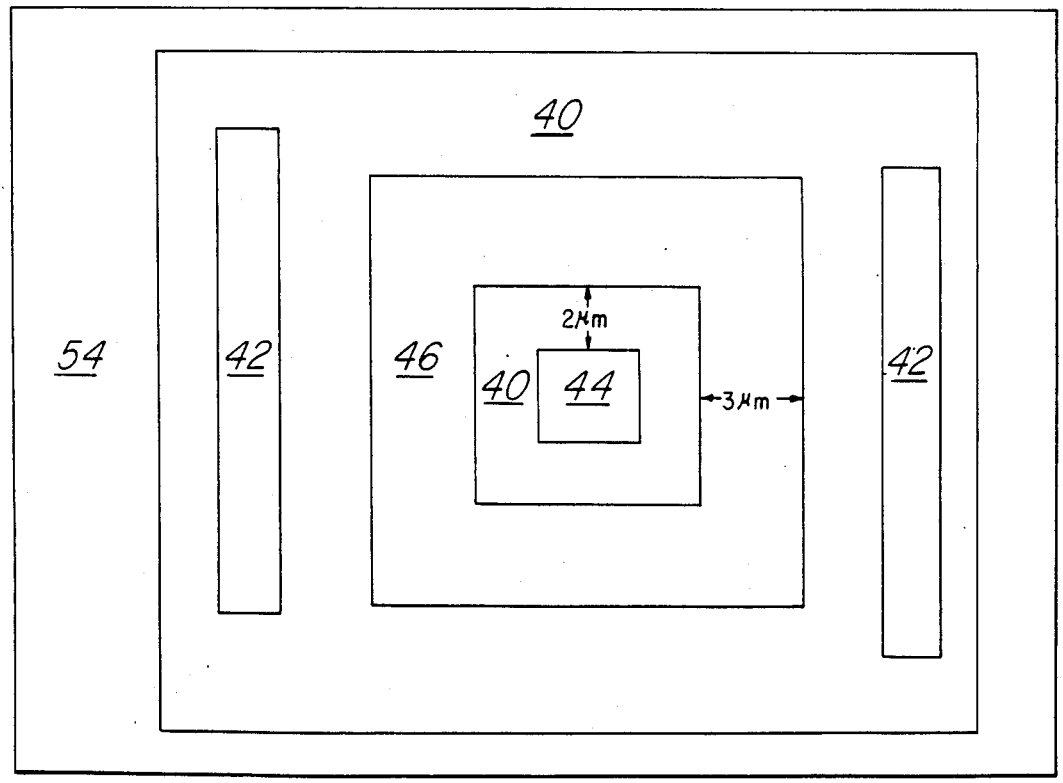

FIGS. 1A-B are schematic cross sectional elevation and plan views of a first preferred embodiment heterojunction bipolar transistor, generally denoted 30, which includes semi-insulating GaAs substrate 32, n type $Al_{0.25}Ga_{0.75}As$ epilayer 34, n− type GaAs epilayer regions 36, p type GaAs epilayer region 38, semi-insulating $Al_{0.25}Ga_{0.75}As$ epilayer regions 40, n type $Al_{0.25}Ga_{0.75}As$ epilayer regions 42 and 44, p+ regions 46 which include portions of the GaAs and $Al_{0.25}Ga_{0.75}As$ epilayers as indicated by the dotted lines, ohmic contacts 48, 50, and 52, and isolation regions 54.

Device 30 operates as a bipolar transistor with n region 44 as the emitter, p+ region 38 as the base, and n region 34 as the collector; n− region 36 and n region 42 connect collector ohmic contact 48 to collector 34, p+ region connects base ohmic contact 52 to base 38, and emitter ohmic contact 50 abuts emitter 44. This use of connecting regions from the ohmic contacts to the base and collector yields the planar character of device 30. Note that regions 40 are semi-insulating which isolates the ohmic contacts and abutting regions in the top $Al_{0.25}Ga_{0.75}As$ epilayer and reduces parasitic leakage currents from the surface and between emitter and extrinsic base; whereas, below this top epilayer are only base and collector type reverse biased junctions. Also note that base contact 46 isolates the emitter from the collector.

Figure 2A:
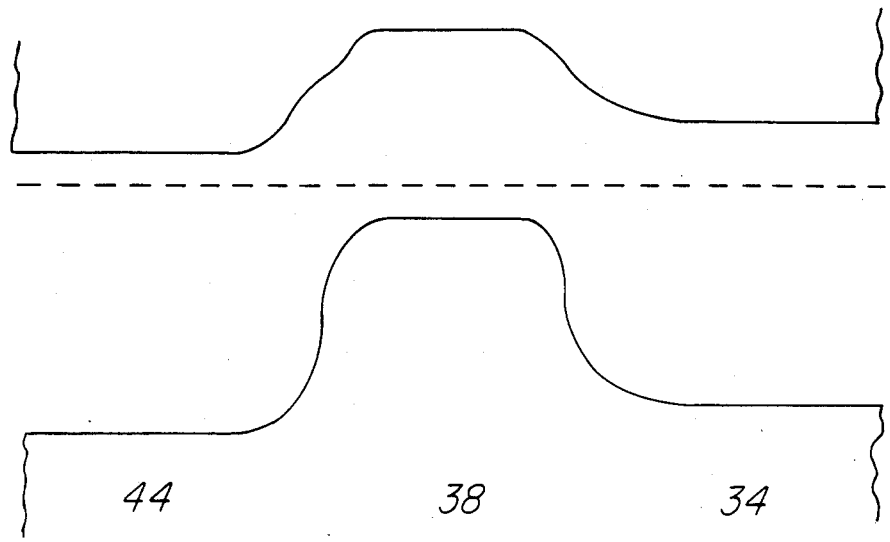
FIGS. 2A-B are illustrative energy band diagrams for the first preferred embodiment transistor.

FIG. 2A illustrates the conduction and valence bands for device 30 along line 2—2 in FIG. 1A at equilibrium; note that the portions of the bands corresponding to regions 44, 38, and 34 have been labeled with the same numbers in FIG. 2A. Note that the discontinuity in the band edges has been suppressed; this reflects a grading of the Al fraction over 100 Å at the heterojunction. See FIG. 2C for a composition profile along line 2—2.

Figure 2B:
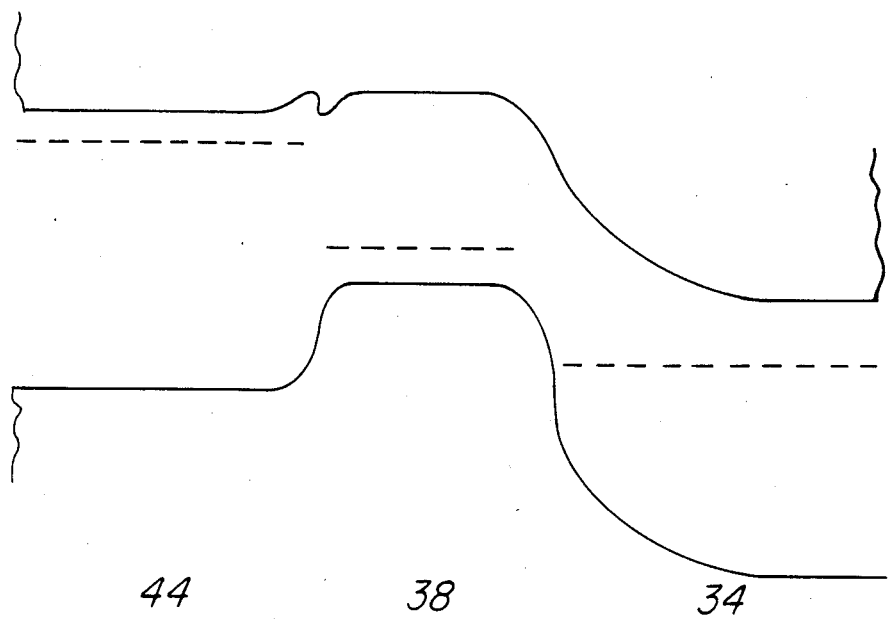
Figure 2C:
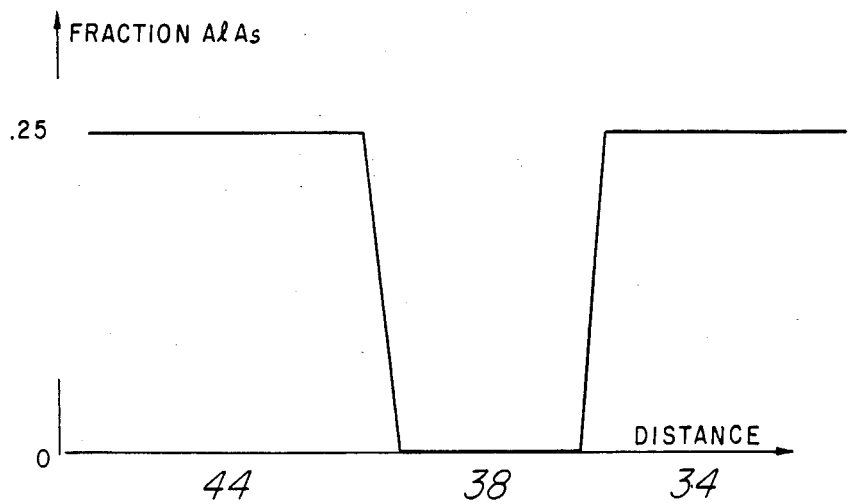
FIG. 2C is a vertical composition profile for this embodiment.

FIG. 2B illustrates the conduction and valence bands for device 30 along line 2—2 in FIG. 2A for the emitter-base heterojunction forward biased and the collector-base heterojunction reverse biased.

Further understanding of the characteristics and operation of device 30 may be had from consideration of the first preferred embodiment method of fabrication which includes the following steps.

Figure 3A:
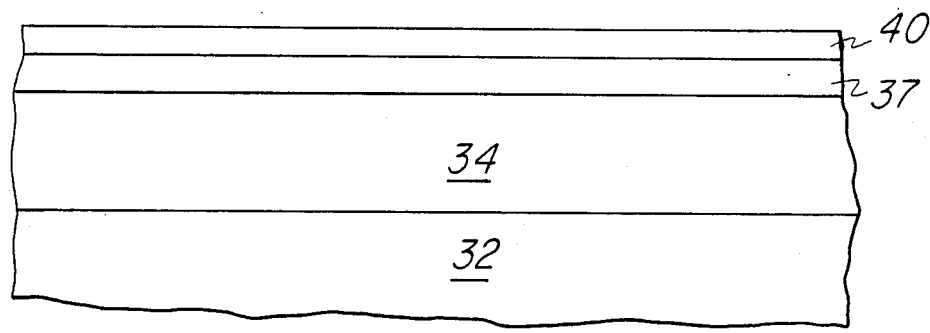
FIGS. 3A-E illustrate the steps of a first preferred embodiment method of fabrication of the first preferred embodiment transistor.

(a) A (100) oriented single crystal GaAs substrate 32 doped with chromium to be semi-insulating has epilayer 34 of $Al_{0.25}Ga_{0.75}As$ grown by molecular beam epitaxy (MBE) to a thickness of 8,000 Å and doped with silicon to a concentration of $3 \times 10^{16}/cm^3$; the last 100 Å has the fraction of Al graded down to zero. Next epilayer 36 of GaAs is grown by MBE to a thickness of 2,000 Å and doped with silicon to a concentration of $3\times10^{16}/cm^3$; and then epilayer 40 of $Al_{0.25}Ga_{0.75}As$ is grown by MBE to a thickness of 2,500 Å and is undoped and semi-insulating, the first 100 Å has the fraction of Al graded from zero up to 0.25. See FIG. 3A; note that these three MBE growths can be performed without withdrawing the substrate from the MBE machine.

Figure 3B:
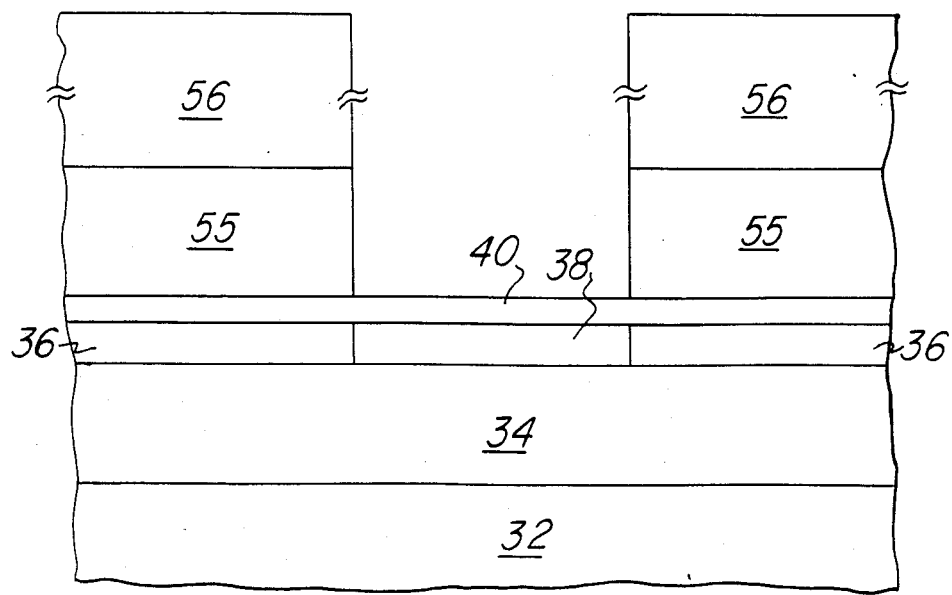

(b) Silicon nitride 55 is deposited by PECVD to a thickness of 8,000 Å and photoresist 56 is spun on and patterned to define a ten micron square base region. The nitride is plasma etched with patterned photoresist 56 as mask, and beryllium is implanted through the patterned opening in photoresist 56 and nitride 55 at an energy of 180 keV and dose of $2\times10^{13}/cm^2$. This implant energy implies that the peak of the beryllium penetration is 3,500 Å and converts the portion labelled 38 of of epilayer 37 into p type and thereby forms base region 38; the remainder of epilayer 37 remains n type and has been labeled 36; see FIG. 3B. Note that the implant energy is selected to create the emitter-base n-p junction precisely at the heterojunction is not as performance sensitive. After the beryllium implantation, photoresist 56 and nitride 55 are removed and the beryllium activated by annealing at 800 C. with a GaAa proximity cap 58.

Figure 3C:
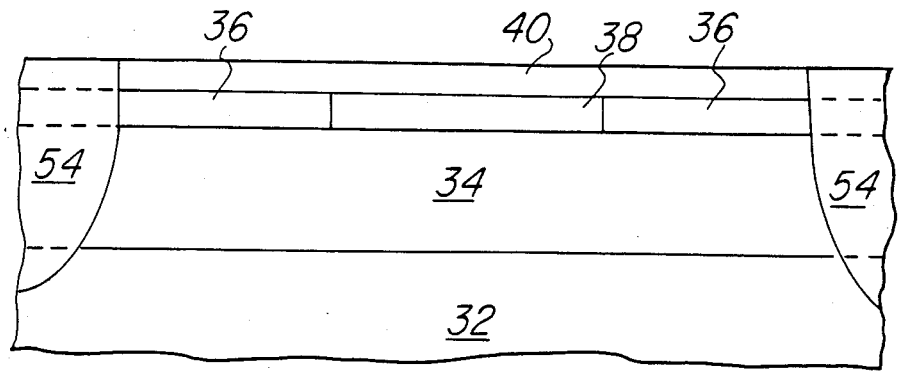

(c) Device moat isolation regions 54 are formed by diffusion of zinc and define the device tub for device 30 to be about twenty-one microns by twenty-six microns. The zinc dopes both the AlGaAs and the GaAs p+ to form junction isolation; another zinc diffusion will be used to form the regions 46 and details of the diffusion will be given in steps (e) and (f). See FIG. 3C.

Figure 3D:
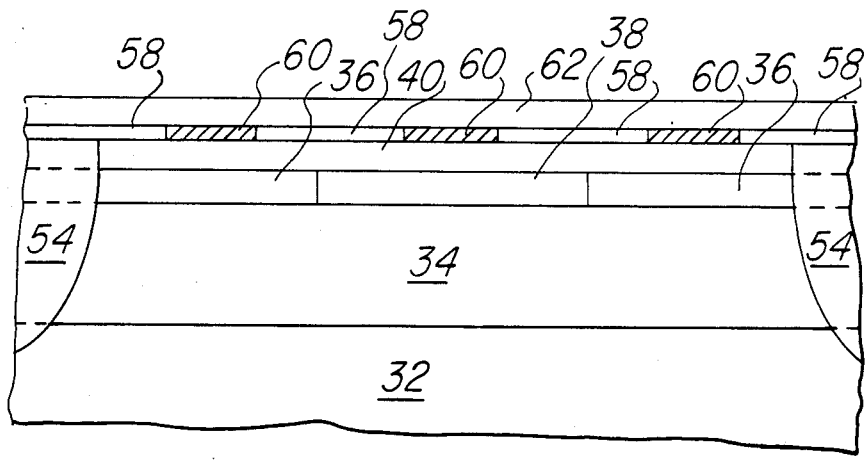

(d) Another 500 Å thick silicon nitride cap 58 is deposited, patterned and etched to open rectangular and square holes for subsequent emitter and collector connection regions 42 and 44 formation (see FIG. 1B); a layer 60 of tin sulfide 500 Å thick is deposited by liftoff to fill the holes in cap 58; and another layer 62 of silicon nitride is deposited by PECVD; see FIG. 3D. A thermal pulse heats the layered substrate to 900 C. and drives in the tin and sulfur to form regions 42 and 44.

Figure 3E:
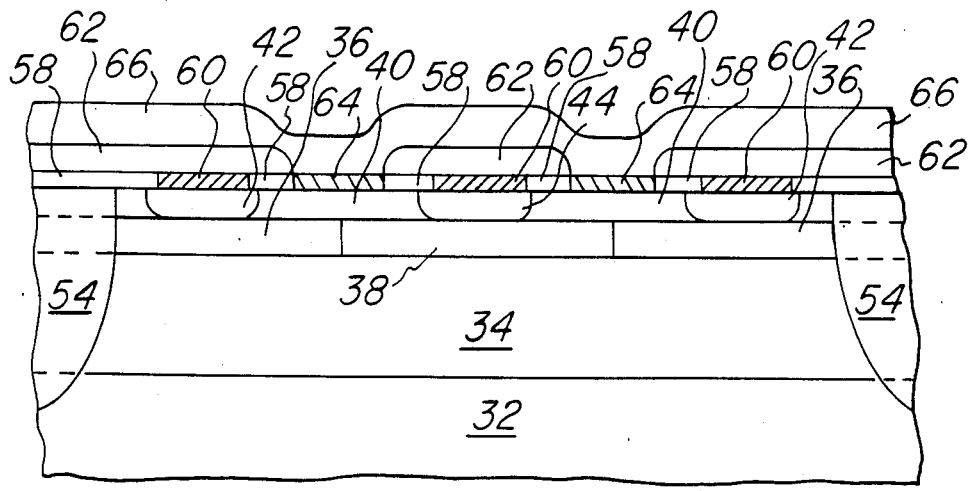

(e) Cap 58 and layer 62 are patterned and etched to open a ring for subsequent base connection regions 46 formation (see FIG. 1B), mixture 64 of 20 percent ZnO and 80 percent $SiO_2$ is sputter deposited to a thickness of 500 Å and lifted off, and a final nitride layer 66 is deposited. See FIG. 3E.

(f) A thermal pulse heating the layered substrate to 725 C. for sixty seconds is applied; this diffuses the zinc of mixture 64 into the layered substrate to form region 46. The layers 58, 60, 62, 64, and 66 are stripped, and ohmic contact material such as gold-germanium is deposited, patterned, and alloyed to form ohmic contacts 48, 50, and 52 to complete device 30; see FIG. 1A. Note that this thermal pulse will also further diffuse the zinc of isolation regions 54, so the regions 54 are initially made smaller than the desired final size.

Observe that the use of diffusions to form the base connections avoids etching to make contact, that the use of zinc diffusion isolation avoids use of mesa isolation, and that the use of undoped $Al_{0.25}Ga_{0.75}As$ semi-insulating layer 40 or 140 avoids the need for a boron implant to limit surface currents and currents between emitter and extrinsic base.

Figure 4:
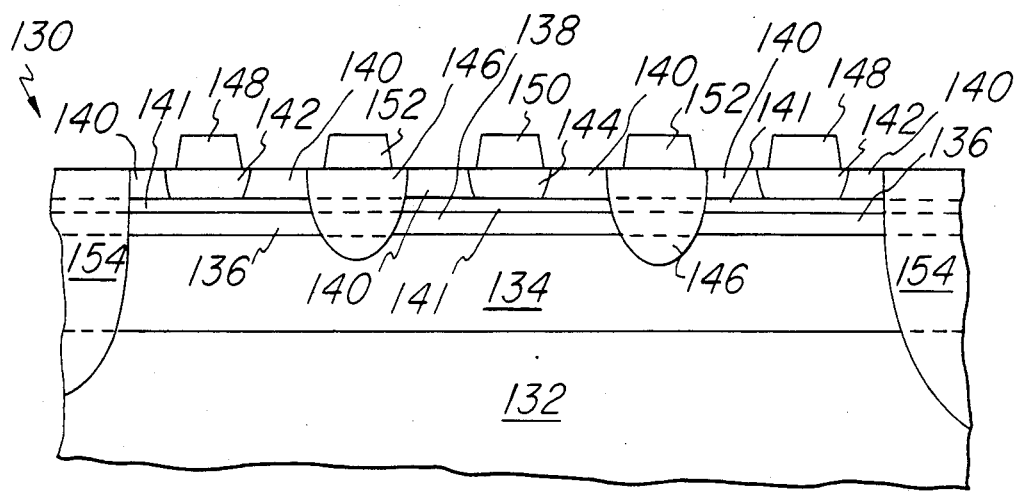
FIG. 4 is a schematic elevation view of a second preferred embodiment transistor.

FIG. 4 is a schematic cross sectional elevation view of second preferred embodiment heterojunction bipolar transistor, generally denoted 130, which includes semi-insulating GaAs substrate 132, n type GaAs epilayer 134, n− type GaAs epilayer regions 136, p type GaAs epilayer region 138, semi-insulating $Al_{0.25}Ga_{0.75}As$ epilayer regions 140, n type $Al_{0.25}Ga_{0.75}As$ epilayer regions 141, 142 and 144, p+ regions 146 which include portions of the GaAs and $Al_{0.25}Ga_{0.75}As$ epilayers as indicated by the dotted lines, ohmic contacts 148, 150, and 152, and p+ isolation regions 154. Device 130 is analogous to device 30 but uses GaAs epilayer 134 instead of $Al_{0.25}Ga_{0.75}As$ epilayer 34 (the collector) and has additional n type $Al_{0.25}Ga_{0.75}As$ epilayer regions 141. Epilayer regions 141 decrease the need for precision in the depth of the diffusion of n dopant sulfur to form region 144 because the emitter-base heterojunction (141-138) is already formed. In contrast, device 30 forms the base by implantation, and the depth of penetration may be precisely controlled; however, the emitter is formed by the sulfur diffusion during the rapid thermal pulse. Thus in device 30 the location of the emitter-base junction at the AlGaAs-GaAs heterojunction depends primarily on the control of the sulfur diffusion depth. Note that epilayer region 141 and the adjacent portion of region 146 form a n−p+ junction that will be forward biased when the emitter-base junction (141-138) is forward biased; however, the 141-146 junction has small area compared to the 141-138 junction, the doping of 146 is higher than that of 138, and the injection of carriers from 144 is away from the 141-146 junction, and these factors lessen the leakage current through the 141-146 junction.

Device 130 is fabricated with steps similar to the previously described with device 30 except an additional $Al_{0.25}Ga_{0.75}As$ epilayer (141 and corresponding portions of 146) is grown to a thickness of 500 Å and doped to a carrier concentration of $5\times10^{17}/cm^3$ with silicon.

Figure 5:
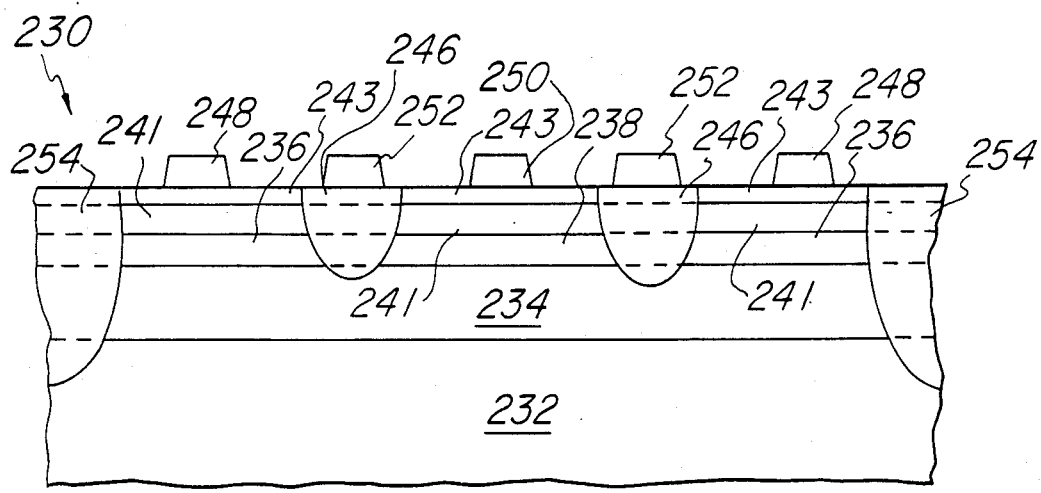
FIG. 5 is a schematic elevation view of a third preferred embodiment transistor.

FIG. 5 is a schematic cross sectional elevation view of third preferred embodiment heterojunction bipolar transistor, generally denoted 230, which includes semi-insulating GaAs substrate 232, n type GaAs epilayer 234, n− type GaAs epilayer regions 236, p type GaAs epilayer region 238, n type $Al_{0.25}Ga_{0.75}As$ epilayer regions 241, n type GaAs epilayer regions 243, p+ regions 246 which include portions of the GaAs and $Al_{0.25}Ga_{0.75}As$ epilayers as indicated by the dotted lines, ohmic contacts 248, 250, and 252, and p+ isolation regions 254. Epilayer 241 is 2,500 Å thick and epilayer 243 is 500 Å thick and both are doped to a carrier concentration of $3\times10^{17}/cm^3$ with silicon. Because regions 241 and 243 are doped, no tin sulfide diffusions are required to make emitter and collector contact.

MODIFICATIONS AND ADVANTAGES

Various modifications of the preferred embodiment devices and methods may be made while retaining the planar feature of the devices and diffusions of the methods. For example, the dimensions and shapes of the device components may be varied, such as the base being circular, oval, triangular, etc. and multiple emitters being used.

Similarly, the device could be p-n-p reversing the dopings of the layers and the diffusions. Or, the base epilayer could be deposited with the base doping type and implanted outside of the base to convert doping type.

Many variations of the materials are possible, for example, the epilayers could be indium gallium arsenide-indium phosphide, mercury cadmium telluride-cadmium telluride, or other systems including quarternary or higher alloys; also gallium arsenide for all the epilayers (these would not be heterojunction devices) or all aluminum gallium arsenide with various fractions of aluminum. And germanium, sulfur, selenium, tellerium, magnesium, and other materials for the dopant diffusions are all possible.

Superlattices can be substituted for the epilayers generally, but, in particular, the emitter material quality in device 30 can be improved by use of a superlattice in place of epilayer 40; a superlattice such as six periods of 200 Å of $Al_{0.3}Ga_{0.7}As$ and 50 Å of GaAs would replace the 1,500 Å of $Al_{0.25}Ga_{0.75}As$.

An undoped GaAs surface cap may be used to facilitate ohmic contacts after the p and n diffusions.

The isolation and contact diffusions permit planar processing and avoid deep via etches and mesas while retaining good vertical transistor characteristics.

We claim:

1. A bipolar transistor, comprising:
   (a) a first planar layer of a first semiconductor material, said first layer including a collector region doped a first conductivity type;
   (b) a second planar layer of a second semiconductor material on said first layer, said second layer including (i) a base region doped a second conductivity type opposite said first type and abutting said collector region and (ii) a first collector contact region doped said first type and abutting said collector region;
   (c) a third planar layer of a third semiconductor material on said second layer, said third layer including (i) an emitter region doped said first type and abutting said base region and (ii) a second collector contact region doped said first type and abutting said first collector contact region;
   (d) a doped region in said second and third layers and of said second conductivity type, said doped region enclosing but not abutting said emitter region in said third layer and enclosing and contacting said base region in said second layer, said doped region a contact through said third layer to said base;
   (e) said first and second collector contact regions in said second and third layers outside of said doped region enclosure and a contact to said collector region;
   (f) an ohmic emitter contact on said third layer and abutting said emitter region;
   (g) an ohmic base contact on said third layer and abutting said doped region; and
   (h) an ohmic collector contact on said third layer and abutting said second collector contact region.

2. The transistor of claim 1, wherein:
   (a) said base region and said emitter region form a heterojunction.

3. The transistor of claim 2, wherein:
   (a) said second layer is gallium arsenide; and
   (b) said third layer is a aluminum gallium arsenide alloy, said alloy with a band gap larger than the band gap of said gallium arsenide.

4. The transistor o claim 3, wherein:
   (a) said doped region is characterized by diffusion of zinc from the surface of said third layer.

5. The transistor of claim 3, wherein:
   (a) said emitter is characterized by diffusion of sulfur from the surface of said third layer.

6. The transistor of claim 2, wherein:
   (a) said heterojunction is graded.

7. The transistor of claim 1, wherein:
   (a) said third layer is doped said first conductivity type in a portion adjacent said base region and is undoped in a portion adjacent and enclosed by said doped region.

8. The transistor of claim 1 further comprising an isolation structure including a diffusion of dopants of the conductivity type of the base of said planar bipolar transistor and enclosing said transistor.

* * * * *